United States Patent

Ganderton

[11] 3,943,779
[45] Mar. 16, 1976

[54] PRE-SET POSITIONING DEVICE

[75] Inventor: Peter Clifton Ganderton, Tollesbury, England

[73] Assignee: Autonnic Limited, Tollesbury, England

[22] Filed: Sept. 23, 1974

[21] Appl. No.: 508,576

[30] Foreign Application Priority Data
Apr. 16, 1974 United Kingdom............... 16655/74

[52] U.S. Cl. .............. 74/10.33; 74/10.27; 74/10.35; 74/10.39
[51] Int. Cl.² ...................................... F16H 35/18
[58] Field of Search............. 74/10.33, 10.31, 10.27, 74/10.22, 10.35, 10.37, 10.39; 334/7

[56] References Cited
UNITED STATES PATENTS

| | | |
|---|---|---|
| 2,933,945 | 4/1960 | Brewster et al..................... 74/10.27 |
| 3,119,273 | 1/1964 | Rabinow............................ 74/10.37 |
| 3,602,051 | 8/1971 | Olah ................................. 74/10.35 |
| 3,863,509 | 2/1975 | Zimatore ........................... 74/10.33 |

*Primary Examiner*—Samuel Scott
*Assistant Examiner*—Randall Heald
*Attorney, Agent, or Firm*—Woodcock, Washburn, Kurtz & Mackiewicz

[57] ABSTRACT

A preset positioning device which is suitable for pushbutton tuners, and in particular for car radios.

The device has a frame with a locator and a reference both mounted on the frame and both movable relative to the frame through respective ranges of corresponding positions. Means are provided for setting cf the locator to a desired position. An actuator is operable either to move the reference to store a set position of the locator or to move the locator to take up a pre-set position stored by the reference.

10 Claims, 4 Drawing Figures

PRE-SET POSITIONING DEVICE

The present invention relates to a pre-set positioning device. Such a device has a locator which is movable relative to a frame. A desired position for the locator may be pre-set in the device. When the locator is not in the desired position it may be returned to that position by operating an actuator to re-set the position of the locator to the desired position.

A typical application for a pre-set positioning device is in a push-button tuner such as is commonly used for car radios or for television sets. The locator of the positioning device is linked to a tuning circuit of the tuner is such a way that the position of the locator determines the frequency, and hence the station, to which the tuner is tuned. Each of the push-buttons comprise a separate actuator for selecting a different station and each must initially be pre-set to move the locator to a position in which the tuner is tuned to a desired station.

This description is mainly in terms of a pre-set positioning device for push-button tuners, but there are other applications in which a pre-set positioning device can be useful, as for example in the control of machine tools.

Due to the adverse conditions under which a car radio, because it is mobile, has to operate, the I.F. bandwidth is limited to a degree such that a tuning frequency error of ± 2Kc's will show a perceptible change in sensitivity. This is a re-set error normally allowed on a standard push button tuner due to the practical limits imposed by its mechanics. It would however be more desirable to reduce this to ± 1Kc. The standard medium wave broadcast band is 1100 KHz wide so a tolerance of ± 2Kc's represents 1/550th of the tuning core movement. The total movement of the core to cover the band is usually 10mm and can have up to 30% non-linearity so that under the worst conditions to obtain re-set accuracy the tuning must be re-positioned to within ± 0.013mm or for a tuning accuracy of ± 1Kc 0.0065mm.

Present pre-set positioning devices have variable position stops which can be fixed in a desired position along an actuator (push-button). The position of a stop along an actuator acts as a reference memory which stores the desired position. When the actuator is operated its stop engages the locator which is biased to press against it. To meet the accuracy requirements outlined above such an arrangement needs to have an actuator which moves over an accurately determined path so that the stop, while remaining in the same position relative to the actuator, also ensures that the locator takes up the same position relative to the frame each time its position is re-set. This imposes severe tolerance restraints during manufacture and is also unsatisfactory in that the mounting of the actuator tends to be the part of the positioning device which wears most in use. These tolerance and wear problems have been overcome in the past either by making the actuators very accurately and solidly (which is expensive) or by sacrificing accuracy so that periodic re-setting of an actuator is required after a few operations.

The preset positioning device of the present invention has a frame, a locator mounted on the frame and movable relative to the frame through a first range of settable positions, setting means for moving the locator to set its position, a reference for storing the position of the locator also mounted on the frame and movable relative to the frame through a second range of positions corresponding to the positions of the first range, and an actuator operable in a first mode to move the reference to store a set position of the locator and a second mode to move the locator to take-up a pre-set position of the reference.

The setting means may simply consist of a part of the locator which is conveniently placed for use as a handle by an operator who wishes to set the position of the locator. Alternatively the setting means may include some form of linkage between a setting knob or handle and the locator. It may be desirable in that case to provide a clutch mechanism to disengage the setting means when the actuator is operated, or at least while the actuator is operated for moving the locator.

The modes of operation of the actuator could simply be determined by whether the setting means is used to hold the locator in position, in which case the first mode of operation will ensue with the reference moving to store the locator position, or whether the setting means is released leaving the locator free to move, in which case the second mode of operation will ensue. This method of separating the two modes relies on friction holding the reference in place.

A preferred method of distinguishing the two modes is for the device to have a clamp for fixing the position of the reference. In the first mode of operation the actuator is operated to release the clamp before moving the reference and then to re-clamp the reference once it is in position. In the second mode of operation the reference remains clamped and the locator is moved. It would also be possible to have a clamp for the locator to clamp it when the reference is unclamped.

The actuator may comprise a push-button which, when pushed, causes a comparator to bring the locator and the reference into corresponding positions. The comparator is preferably mounted on the actuator and operated each time the actuator is operated regardless of the mode.

The important point is that the reference (which performs a function analogous to the more usual stop) is mounted on the frame instead of on the actuator. This allows the actuator to have relatively sloppy tolerances since it only has to bring the reference and the locator into corresponding positions which can be done with a loosely mounted comparator.

In a preferred embodiment the reference may include a pin made from high-grade steel (e.g. a roller suitable for a roller bearing). The locator has a corresponding pin. To bring these two parts into corresponding positions their pins are aligned by a comparator which consists of a Y-shaped member made of nylon with splayed prongs and a throat in which the pins are a push fit. When the actuator is operated the splayed prongs engage the pins and guide them to the throat. The comparator and a free one of the pins are free to move and so both of the pins and the throat end up in a position determined by the fixed one of the pins.

When the pre-set positioning device is used with a tuner it is preferable for the locator to act directly on a variable tuning device to avoid engineering tolerance problems on a linkage between the locator and the tuning device.

An embodiment of the invention, as applied to a push-button radio tuner will be described in detail by way of example with reference to the accompanying drawings, in which.

Figure 1:
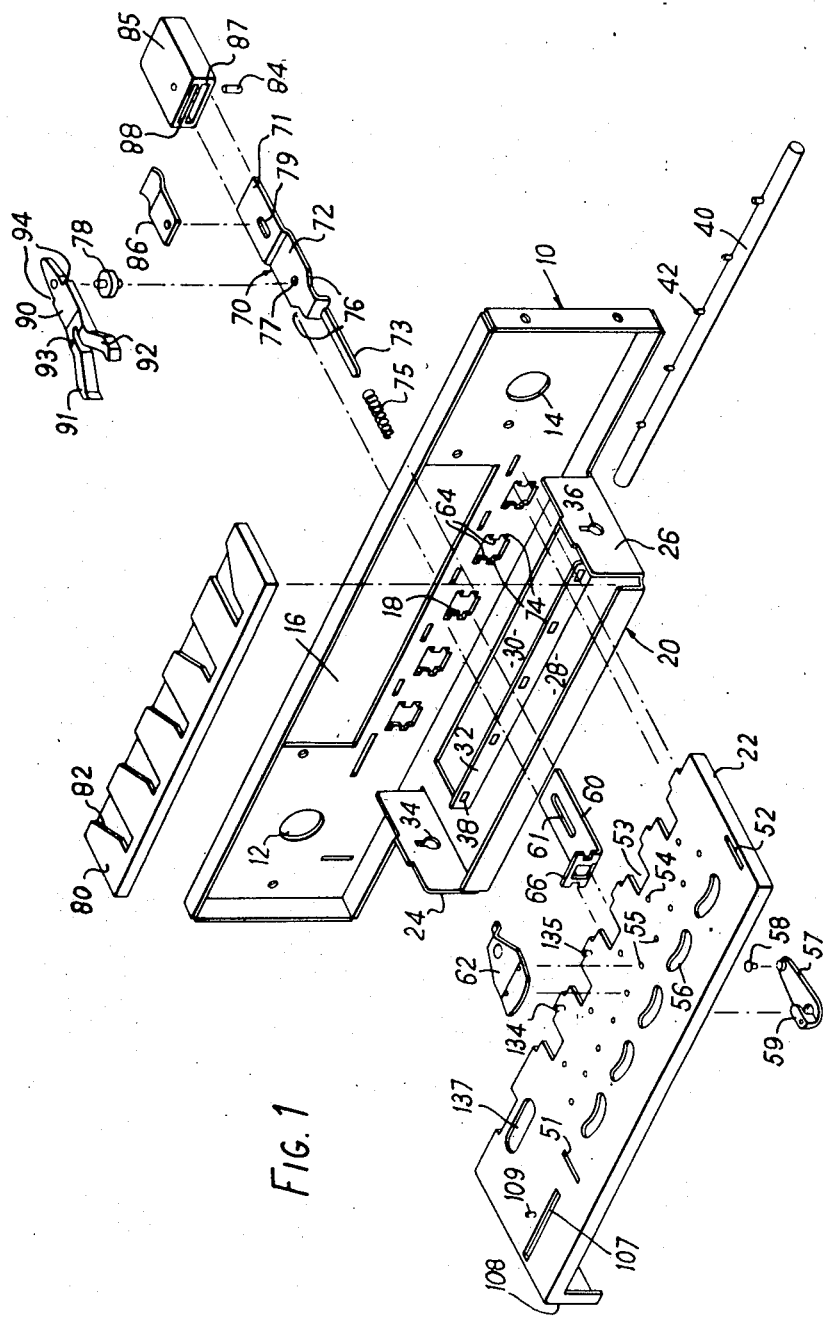
FIG. 1 is an exploded perspective view of a tuner push-button device looking outwards from the inside of the tuner and showing the positioning components.
Figure 3:
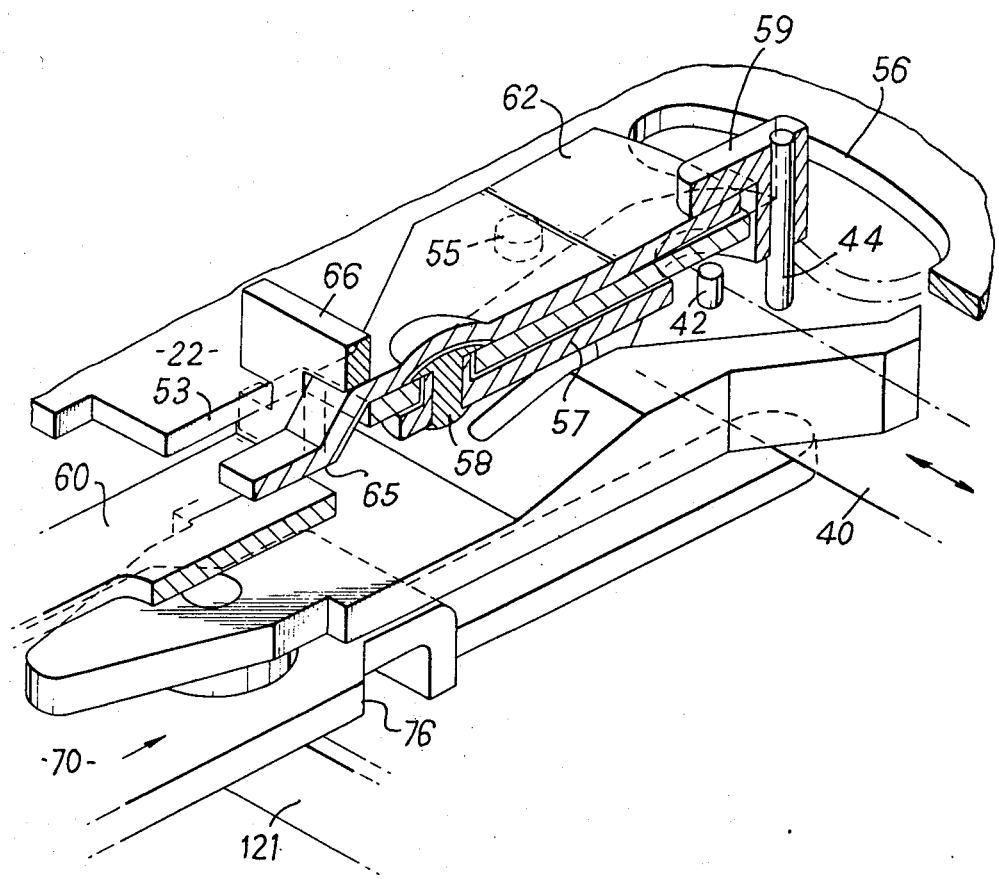
FIG. 3 is a partially cutaway perspective view showing the positioning components assembled.

Referring to FIGS. 1 and 3, a tuner front plate 10 of a standard size to be fitted in a car has two round holes 12 and 14 near its ends for a tuning knob and a volume control knob respectively, an elongate hole 16 occupying most of the upper half of its centre region for a tuning display, five generally square holes 18 beneath the tuning display hole 16 for passing push-buttons, and a backwardly projecting tray 20 for mounting the positioning mechanism. The front plate 10 also has various holes for receiving fixing screws and slots for locating a top cover 22 of the tray 20.

The tray has two upstanding ends 24 and 26 adjacent the outermost ones of the push-button holes 18 so that the push-bottons are all received into the tray 20 between the ends 24 and 26. It has a flat floor 28 over the rear half of its underside and an elongate cut-out 30 occupying the front half of its underside. The front and rear edges of the floor 28 are bent upwards and the front edge 32 has five slots 38 which act as guides for the push-buttons which also pass through the holes 18. The ends of the tray 24 and 26 are pierced by respective key-hole shaped apertures 34 and 36 for holding a tuning bar 40 which is the locator of the positioning device and is free to move to left and to right, parallel to the front plate 10 while sliding through the apertures 34 and 36. The tuning bar 40 has five upstanding pins 42 which are of a size to pass through the slot parts of the key-hole shaped openings 34 and 36.

The tray cover 22 has two locating slots 51 and 52 which hold upwardly projecting tongues on the ends 24 and 26. The cover 22 overhangs the end 24 of the tray 20 and provides a base on which the tuning components are mounted. The part of the cover 22 which is over the tray has five similar sets of slots and deformations; one set for each push-button. The sets each comprise a slot 53 aligned with its corresponding hole 18 for guiding a lock-arm 60, a bearing hole 54 near the end of the slot 53, two dents 55 forming an equilateral triangle with the bearing hole 54 and a banana-shaped slot 56 having curved sides centred on the bearing hole 54. The dents 55 serve to maintain the angular position of a reference lock 62 on the top of the cover while the bearing hole 54 and the banana-shaped slot 56 are used in conjunction with a reference arm 57 which is pivoted at the bearing hole 54 by a rivet 58 and which has a lock-engaging hook 59 that projects through the banana-shaped slot 56 and curves over the top of the cover 22. The end of reference arm 57 which is free to move in the banana-shaped slot 56 has a downwardly directed reference pin 44 (see FIG. 3) which is aligned with a pin 42 of the tuning bar.

Each push-button comprises a push-rod 70 comprising two relatively broad flat portions 71 and 72 slightly joggled with respect to each other and a relatively long narrow backwardly projecting tail 73 which is joggled further below the rear portion 72 than the rear portion 72 is joggled below the front portion 71. The edges of the rear portion 72 engage lower slots 74 in the sides of the generally square holes 18 and the tail 73 passes through one of the guide holes 38. Wrapped around the tail 73 is a coil compression return spring 75 which occupies the cut-out 30 and acts between the front edge 32 of the floor and the joggle between the tail 73 and the rear portion 72 of the push rod 70 to bias the push-button forwardly.

A switch lever 80 is free to slide on the floor 28 and has cam shaped grooves 82 one of which engages the tail 73 of a push-button each time any push-button is operated and causes the switch lever to move to left or to right. The switch lever 80 may be used to switch between long wave and medium wave.

The rear end of the rear flat portion 72 of the push-rod 70 has sloping cam-shoulders 76 for engaging a clutch operator 121 to release the tuning mechanism of the tuner from the tuning knob when the push-button is operated. This is described below with reference to FIGS. 2 and 4. The rear flat portion 72 also has a bearing 77 in which a spacer 78 is mounted to hold a comparator 90. The comparator is made of plastics material such as nylon or acetal and comprises a Y-shaped member with backwardly directed splayed prongs 91 and 92 leading to a throat 93. The forward end of the comparator 90 has squared shoulders 94 which engage the sides 64 of the hole 18 and prevent the push-button being pulled out through the front plate 10 of the tuner.

The forward flat portion 71 of the push-rod 70 has a longitudinally extending centre slot 79 through which a button-engaging pin 84 passes to fix a plastics button 85 to the push rod 70 the push-rod is received in a lower slot 87 of the button 85. A button latch 86 is also fixed by the pin 84 and the assembly of the button 85, the pin 84 and the latch 86 is free to slide along the push rod for the length of the slot 79. Also engaged with the pin 84 is a longitudinally-extending slot 61 of the lock arm 60 which is received in an upper slot 88 of the button 85. This sliding button arrangement is well known in push-button tuners and the arrangement is such that when the button 85 is pulled forwardly the latch 86 engages the end of the push-rod 70 and prevents the button 85 from sliding back along the push-rod 70 until the push-rod 70 meets a stop. Then the latch 86 will ride up over the end of the push-rod 70 and be returned to its normal position on top of it.

Figure 2:
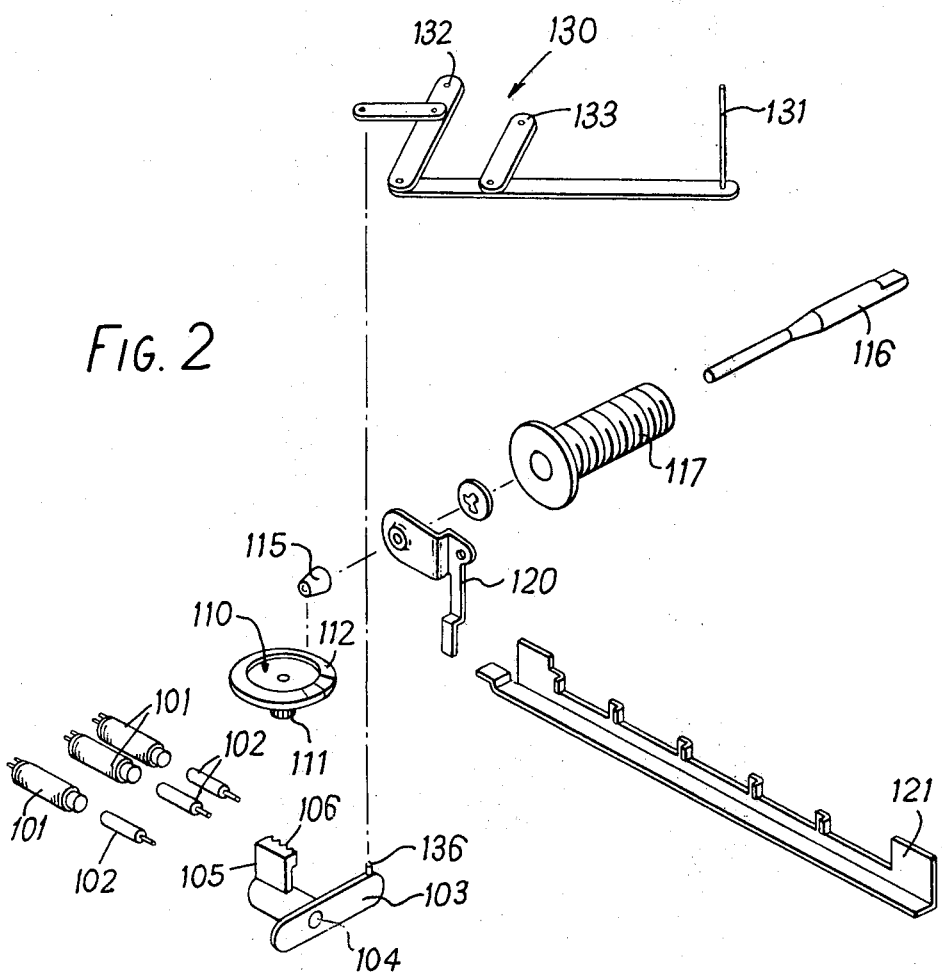
FIG. 2 is an exploded view similar to FIG. 1 showing the tuning components.
Figure 4:
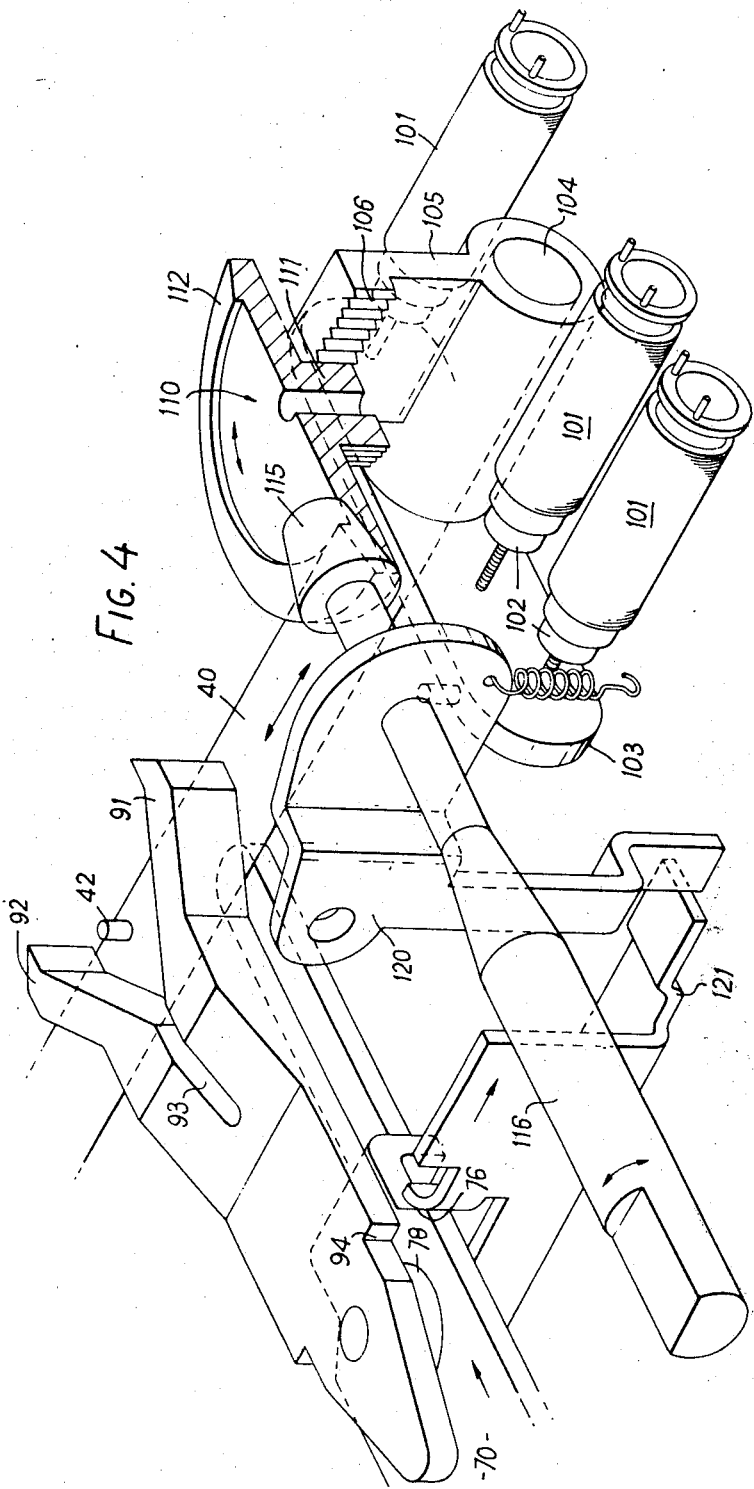
FIG. 4 is a similar view to FIG. 3 showing the tuning components assembled.

FIG. 2 shows tuning components to the same perspective as the positioning components in FIG. 1, and FIG. 4 shows the components assembled. Three tuning coils 101 have movable cores 102 which are connected to a core carriage 103. The core carriage 103 has a bore 104 for receiving the tuning bar 40 and sideways movement of the tuning bar 40 causes the cores 102 to move in-and-out of their coils 101 and hence vary the tuning of the tuner. The core carriage 103 has an upstanding flange 105 capped by a rack gear 106. This flange 105 and rack 106 projects upwardly through a slot 107 in the cover 22 of the tray 20. The coils 101 are mounted on a downwardly projecting end 108 of the cover 22.

Next to the slot 107 on the cover there is a pivot 109 for tuning drive wheel 110. The drive wheel has a small diameter pinion 111 for engaging the rack 106 and larger diameter friction bevel 112 for engaging a bevel 115 on a tuning spindle 116 which is held in the tuning knob hole 12 by a bush 117. The tuning spindle 116 passes through a clutch arm 120 near to the bevel 115 in an arrangement for lifting the spindle bevel 115 off the drive bevel 112 during operation of a push-button so that there is no tendency to try to spin the tuning spindle 115 when the tuning is altered by operating a push-button. A clutch operator 121 lies near the front of the front plate 10 and is cammed to operate the clutch arm 120 by the cam shoulders 76 of the push-buttons.

Tuning is indicated by a lever arrangement 130 having an upstanding pointer 131 which is visible in the tuning display hole 16 and having two pivot points 132 and 133 which pivot about pins 134 and 135 on the cover 22. The lever arrangement 130 is driven by a link connected to a pin 136 on the core carriage 103. The cover 22 has a slot 137 through which the pin 136 projects.

To pre-set a push-button to a desired station the procedure is as follows. Firstly the desired station is tuned by turning the tuning spindle 116 to move the cores 102 in their coils 101. The relative diameters of the bevel friction gears 112 and 115 and of the drive wheel bevel 112 and the pinion 111 provide a considerable reduction for ease of tuning. When a desired station has been tuned the tuning bar 40 will be in a desired position which will be set by locking one of the reference pins 44 over one of the tuning-bar pins 42. Thus tuning spindle 116 and the components linking it to the tuning bar 40 constitute the setting means of this pre-set positioning device.

Normally the reference arm 57, although pivoted about the rivet 58, is clamped into position by means of the reference-lock 62 jamming between the hook 59 and the cover 22. The lock 62 is held in position by a bridge 66 on the lock arm 60. To unlock the reference arm 57 the button 85 is pulled forwards causing the pin 84 to slide in the slot 79 of the push-rod 70 and to take the lock-arm 60 forwards with it. The lock 62 is then free to rock so that its forward end 65 goes up and its rear end disengages the hook 59 of the reference arm 57. A tongue on the forward end 65 prevents complete disengagement of the lock 62 from the bridge 66 while the dents 55 in the cover 22 prevent lateral movement of the lock 62. When the button 85 is pulled forwards it is held in the forward position by the latch 86 but the lock remains free to slide relative to the button 85. The shoulders 94 of the comparator 90 provide the stop against which the button 85 is pulled along the push-rod 70.

The button is then pushed backwardly. As it moves the first action is for the cam shoulders 76 to engage the clutch operator 121 and cause the clutch arm 120 to rotate and lift the spindle bevel 115 off the drive wheel bevel 112. This action is pointless in the set mode of operation but prevents attempts to spin the spindle 116 during operation in a reset mode. The next action is for the prongs 91 and 92 of the comparator 90 to engage the pin 42 of the tuning bar and 44 of the reference arm. Since it is free to rotate the comparator rotates so that the throat 93 ends up embracing both pins in the position of the more fixed pin which in this instance is the tuning bar pin 42. The reference pin now has the same position to the tuning pin and because both pins are made of accurately dimensioned steel (being roller bearings) and because the comparator has a resiliently tight throat 93 the positioning is sufficiently accurate for tuning over the medium wave. The last action is for the button latch 86 to ride up back onto the push-rod 70 allowing the button to move back along the push-rod 70 and thereby return the lock arm 60 to its rear position. This action jams the reference arm 57 in position by means of the reference-lock 62.

After the push-button has been released the original station may be re-tuned simply by pushing-in the push-button without any of the pulling forward complications. The lock-arm 60 does not move for a normal throw of the push-button and it keeps the reference arm 57 locked in position. Subsequent pushing-in of the push button again causes the comparator to bring the two pins in alignment in the position of the more fixed pin which is now the locked reference pin 44. There is no need for a locking system for the tuning bar 40 since friction proves to be sufficient, but if there were need then it could be provided on the same lines as the tuning clutch release and switched on by any of the lock arms 60 taking up a forward (unlocked) position.

It may be advantageous to arrange for the clutch to be disengaged for the shortest possible time, i.e. only during the time in which the tuning bar 40 is acutally being moved by the comparator during a reset operation. A first advantage of such an arrangement would be that less reliance would be placed on the tuning bar remaining in position because of friction during a setting operation, and a second advantage would be that a position of the button would exist, after alignment of the locator and the reference but before the reference is clamped in which a final tuning adjustment could be made using the tuning knob to move both the locator and the reference together. Naturally the clutch acting mechanism would be more complicated with such an arrangement.

Clearly it is advantageous for the comparator 90 to bring the reference pin 44 and the pin 42 of the tuning bar (the locator) together so that the dimensional stability of the comparator is of very little importance. However the bringing together of reference and locator is not essential and a device could be devised in which the comparator held the reference and the locator at some predetermined distance apart.

Because of the small number of moving parts associated with the preset tuning and because there are no linkages between the tuning bar 40 and the tuning elements 101 and 102 normal engineering tolerances may be used for the construction of the push-button tuner in spite of accuracy requirements and also the machanism may be made smaller than has previously been possible. This has advantages in that there may now be room for a tape cassette or tape cartridge transport mechanism and a push-button tuner to be fitted in a standard car-radio sized opening. In the embodiment described the display would have to be reduced in height and the tape cassettes inserted through the hole 16. Embodiments have been made both with tape cassette and with tape cartridge transport mechanisms for the 7 inches × 2 inches size of standard car-radio opening but, at present, only an embodiment with a tape cassette transport mechanism has been made for the smaller 7 inches × 42 mm size of standard car-radio opening.

I claim:

1. A preset positioning device comprising a frame, a locator mounted on the frame and movable relative to the frame through a first range of settable positions, the locator having a locator pin mounted thereon and movable therewith, a setting means for moving the locator to set its position, a reference pin mounted on the frame and movable relative to the frame through a second range of positions corresponding to the positions of the first range, and an actuator operable in a first mode to move the reference pin to store a set position of the locator pin and in a second mode to move the locator pin to take up a preset position stored by the reference pin, the actuator having a comparator with two forwardly splayed prongs and an aligning throat at the junction of the two prongs, the prongs being arranged to engage both of the said pins and cam them into the aligning throat.

2. A preset positioning device according to claim 1 including a clamp for fixing the position of the reference pin except during the first mode of operation of the actuator.

3. A preset positioning device according to claim 1 wherein the reference pin and the locator pin are aligned axially in the aligning throat.

4. A preset positioning device according to claim 1 wherein the reference pin and the actuator pin are aligned radially in the aligning throat.

5. A preset positioning device according to claim 1 wherein the reference pin and the locator pin are both made of accurately dimensioned steel.

6. A preset positioning device according to claim 1 wherein the comparator is made of plastics material.

7. A preset positioning device according to claim 1 wherein the actuator is a push-button assembly disposed to move at right angles to the direction of movement of the locator.

8. A preset positioning device according to claim 1 wherein the reference pin is mounted on an arm which is rotatable about a fixed point of the frame, the resulting arc of movement of the reference pin being substantially parallel to the range of movement of the locator.

9. A push-button tuner comprising the preset positioning device of claim 1 associated with tuning means.

10. A combined push-button car radio tuner and tape player which includes the preset positioning device of claim 1 and thereby leaves sufficient space for a tape container to be introduced into the tape player through a gap between the push-buttons and the edge of the standard-sized hole provided for radios in cars.

* * * * *